United States Patent [19]

Tokuhiro

[11] Patent Number: 5,028,926
[45] Date of Patent: Jul. 2, 1991

[54] SUCCESSIVE TYPE ANALOG-TO-DIGITAL CONVERTER WITH A VARIABLE REFERENCE VOLTAGE FOR THE DIGITAL TO ANALOG CONVERTER

[75] Inventor: Noriyuki Tokuhiro, Yokohama, Japan

[73] Assignee: Fujitsu Limited, Kawasaki, Japan

[21] Appl. No.: 447,074

[22] Filed: Dec. 7, 1989

[30] Foreign Application Priority Data

Dec. 7, 1988 [JP] Japan .................. 63-309601

[51] Int. Cl.⁵ ............................................ H03M 1/46
[52] U.S. Cl. ................................... 341/161; 341/155
[58] Field of Search ............... 341/155, 161, 162, 163, 341/165

[56] References Cited

U.S. PATENT DOCUMENTS

| 4,196,420 | 4/1980 | Culmer et al. | 341/165 |
| 4,314,235 | 2/1982 | Ruf et al. | 341/165 |
| 4,647,903 | 3/1987 | Ryu | 341/163 |
| 4,823,130 | 4/1989 | Wright et al. | 341/162 |

FOREIGN PATENT DOCUMENTS

| 52-119161 | 10/1977 | Japan . | |
| 53-109463 | 9/1978 | Japan . | |
| 54-55110 | 2/1979 | Japan | 341/163 |
| 60-066524 | 4/1985 | Japan . | |
| 60-170329 | 9/1985 | Japan . | |
| 61-284117 | 12/1986 | Japan . | |
| 62-133819 | 6/1987 | Japan . | |
| 63-248221 | 10/1988 | Japan . | |
| 01-30331 | 2/1989 | Japan | 341/161 |

Primary Examiner—A. D. Pellinen
Assistant Examiner—H. L. Williams
Attorney, Agent, or Firm—Staas & Halsey

[57] ABSTRACT

A successive approximation analog to digital converter is provided with a variable reference voltage. A comparator compares an analog input voltage and an analog comparison voltage to obtain a digital output signal. Before the analog comparison voltage becomes lower than the analog input voltage, the first time after the analog to digital conversion starts, the second digital signal is changed in response to a first clock signal to decrease the reference voltage so that the first digital signal output form the first register is not changed. After the analog comparison voltage becomes lower than the analog input voltage the first time after the analog to digital conversion starts, the second digital signal is not changed so that the reference voltage is kept constant. The first digital signal is then changed in response to a second clock signal and the digital output signal to change the analog comparison voltage, whereby the bit member of the digital-to-analog converter is reduced.

19 Claims, 9 Drawing Sheets

SUCCESSIVE TYPE ANALOG-TO-DIGITAL CONVERTER WITH A VARIABLE REFERENCE VOLTAGE FOR THE DIGITAL TO ANALOG CONVERTER

BACKGROUND OF THE INVENTION

1. Technical Field

The present invention relates to a successive comparison type analog-to-digital converting apparatus for converting an analog signal into a digital signal.

2. Description of the Related Art

Cross references related to the successive comparison type analog-to-digital converting apparatus are as follows:

(a) Japanese Unexamined Patent Publication (Kokai) No. 63-248221 published on Oct. 14, 1988, disclosing a conventional successive type analog-to-digital converter having means for correcting an output digital code;

(b) Japanese Unexamined Patent Publication (Kokai) No. 62-133819 published on June 17, 1987, disclosing an analog-to-digital converter which can attain a high accuracy by the use of an A/D converter with a small bit number;

(c) Japanese Unexamined Patent Publication (Kokai) No. 61-284117 published on Dec. 15, 1988, disclosing a conventional successive comparison type analog-to-digital converter in which, to attain a high speed operation, a simplified circuit construction and ability to operate with a single clock signal, latching means are appropriately provided;

(d) Japanese Unexamined Patent Publication (Kokai) No. 60-170329 published on Sept. 3, 1985, disclosing a conventional successive comparison type analog-to-digital converter in which, to attain a decreased number of circuit elements and cost, and to realize an efficient use of space and high accuracy, successive comparisons are effected by the use of several reference voltages;

(e) Japanese Unexamined Patent Publication (Kokai) No. 60-66524 published on Apr. 16, 1985, disclosing a conventional successive comparison type analog-to-digital converter in which, to attain a high speed operation and high accuracy, D/A converters with small bit numbers are employed;

(f) Japanese Unexamined Patent Publication (Kokai) No. 53-109463 published on Sept. 25, 1978, disclosing a conventional successive comparison type analog-to-digital converter in which, to attain a high speed operation and a simplified circuit, a divisional circuit and an analog subtractor are employed instead of a D/A converter; and (g) Japanese Unexamined Patent Publication (Kokai) No. 52-119161 published on Oct. 6, 1977, disclosing a conventional analog-to-digital converter by which the dynamic range is expanded without deteriorating the accuracy.

In a conventional successive comparison type analog-to-digital converting apparatus, when an n-bit analog-to-digital converting apparatus is to be formed, an n-bit digital-analog converter is necessary. The digital-analog converter, however, has a problem in that the size and cost rapidly increase depending on the number of bits.

Also, to decrease the cost of the analog-to-digital converting apparatus, if the number of bits of the digital-analog converter is decreased, there is a problem in that the accuracy of the converted digital value is reduced as later described in more detail with reference to the drawings.

SUMMARY OF THE INVENTION

To solve the above-mentioned problems, the present invention has an object to provide a successive comparison type analog-to-digital converting apparatus in which the accuracy as an analog-to-digital converting apparatus is not largely or adversely lowered even when a digital-analog converter having a bit number smaller than the bit number necessary for an analog-to-digital converting apparatus is used.

To attain the above object, there is provided, according to the present invention, a successive comparison type A/D converter for converting an analog input voltage into a digital output signal, comprising: a comparator for comparing the analog input voltage and an analog comparison voltage to output the digital output signal; a D/A converter for generating the analog comparison voltage by changing a reference voltage in response to a first digital signal; a first register for storing the digital output signal output from the comparator and for providing the first digital signal; a reference voltage generator for generating the reference voltage by changing a predetermined voltage in response to a second digital signal; a second register for storing the second digital signal; wherein before the analog comparison voltage becomes lower than the analog input voltage for the first time after the A/D conversion starts, the second digital signal is changed in response to a first clock signal so as to decrease the reference voltage, and the first digital signal output from the first register is not changed; and after the analog comparison voltage becomes lower than the analog input voltage for the first time after the A/D conversion starts, the second digital signal is not changed so that the reference voltage is kept constant, and the first digital signal is changed in response to a second clock signal and in response to the digital output signal from the comparator so as to change the analog comparison voltage.

First, the reference voltage generator generates the maximum value necessary for A/D conversion. Then, a voltage ($\frac{1}{2}$ of the reference voltage) corresponding to the voltage of the most-significant bit is output from a D/A converter as an analog comparison voltage to be used in the comparator. The comparator compares the analog comparison voltage with an input voltage. When the input voltage is lower than the analog comparison voltage, namely, when the output of the comparator is "0", to change the output of the analog converter, the contents of the register are not changed but the reference voltage of the analog converter is made to be $\frac{1}{2}$. This operation is effected from the start of the A/D conversion to the time when the output of the comparator first turns to "1", or up to the time when the remaining bits for AD conversion correspond to the number of bits of the AD converter.

And, when the number of the converted bits is smaller than the number of bits of the A/D converter, the number of "0" bits are added to the lower order side of the digital signal after the A/D conversion to harmonize the number of bits.

BRIEF DESCRIPTION OF THE DRAWINGS

The above and other object and features of the present invention will be more apparent from the following description of the preferred embodiment with reference to the accompanying drawings, wherein.

DESCRIPTION OF THE PREFERRED EMBODIMENT

For a better understanding of the present invention, a conventional analog-to-digital converting apparatus will first be described with reference to FIGS. 1 to 3.

Figure 1:
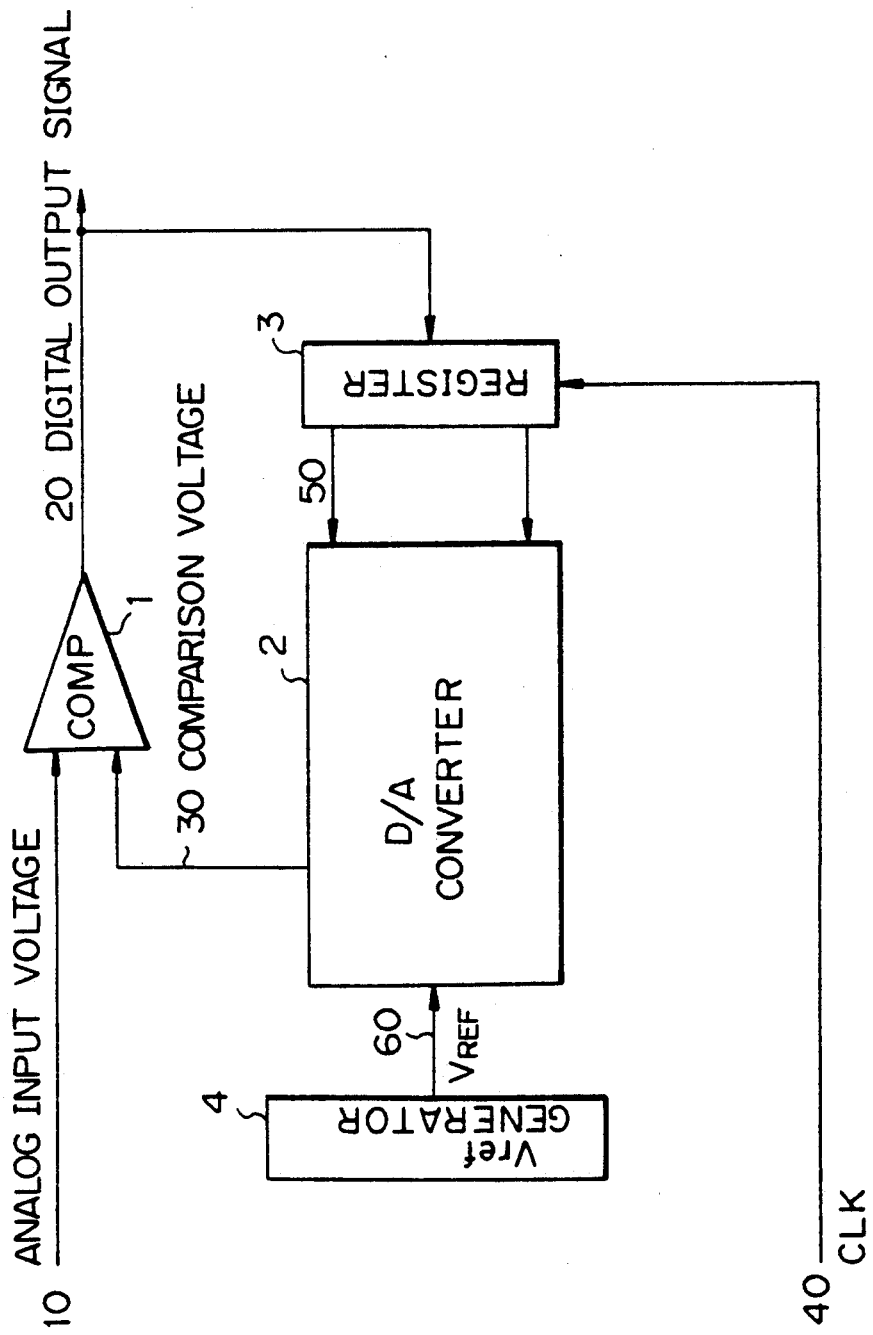
FIG. 1 is a block construction diagram of a successive comparison type analog-to-digital converting apparatus in a conventional example.
Figure 2:
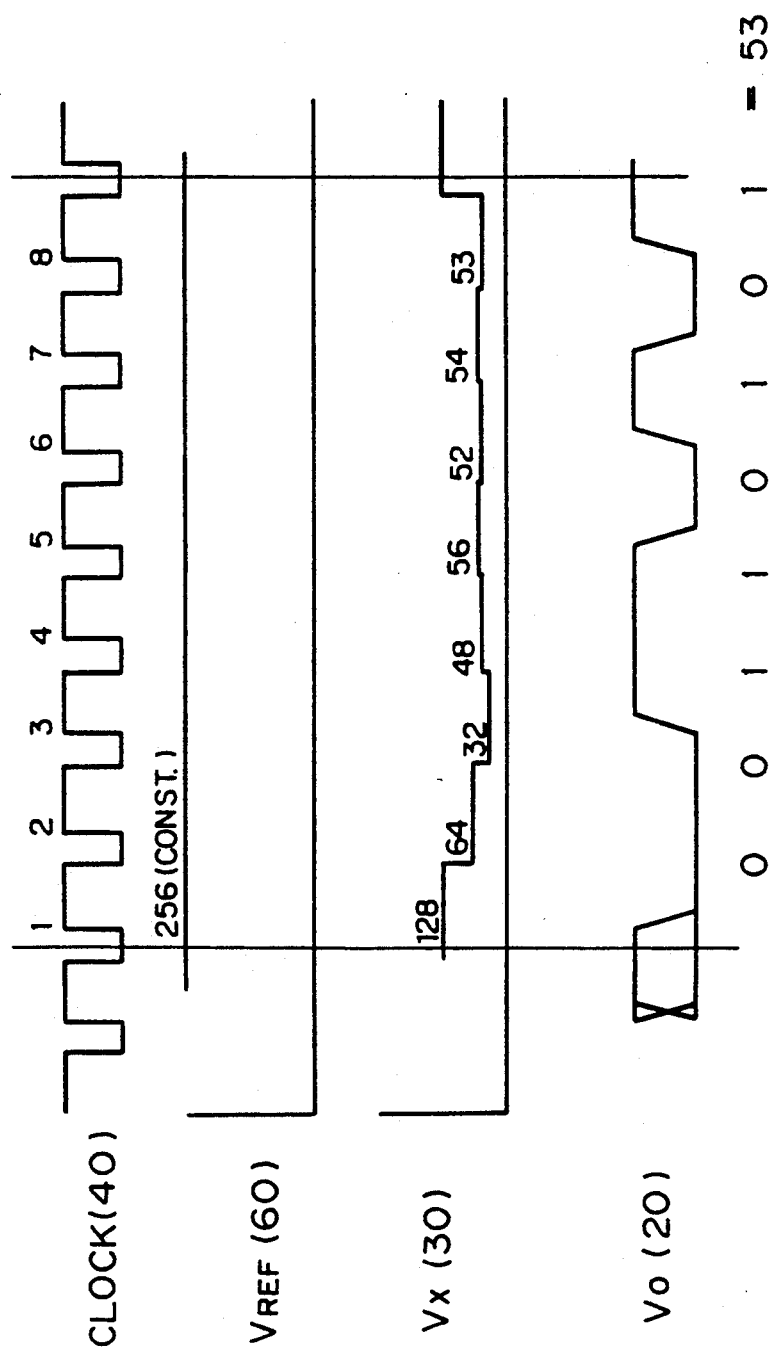
FIG. 2 is a waveform diagram for explaining the operation of the successive comparison type analog-to-digital converting apparatus in a conventional example when a 8-bit D/A converter is used.
Figure 3:
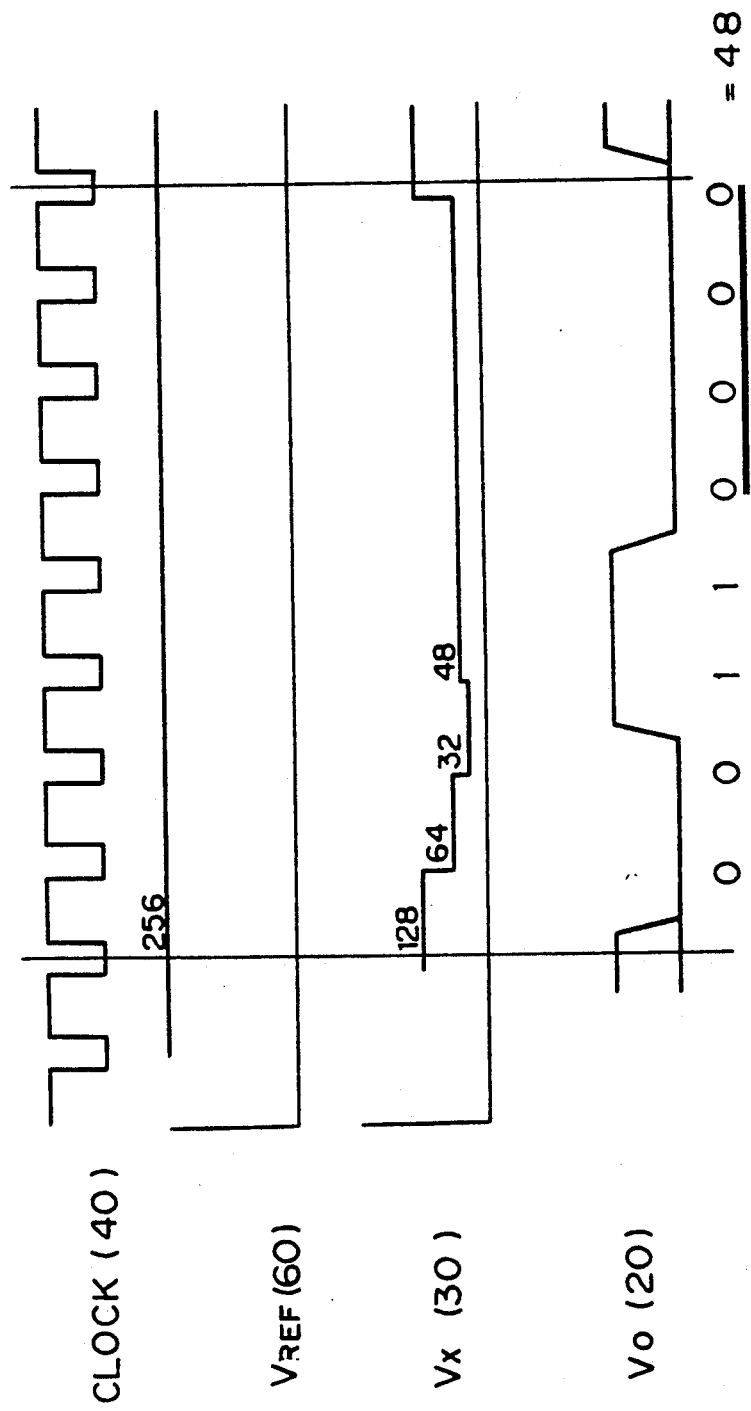
FIG. 3 is a waveform diagram for explaining the operation of the successive comparison type analog-to-digital converting apparatus in a conventional example when a 4-bit D/A converter is used.

FIG. 1 is a block diagram of a conventional successive comparison type analog-to-digital converting apparatus (hereinafter referred to as A/D converter), and FIG. 2 and FIG. 3 are diagrams explaining the operation of the conventional successive comparison type A/D converter.

In FIG. 1, 1 is a comparator, 2 is a digital-to-analog converter (herein after referred to as a D/A converter) for generating a comparison voltage applied to the comparator 1, 3 is a register for successively storing digital signals output from the comparator 1, 4 is a reference voltage generator for providing a reference voltage to the D/A converter 2, 10 is an analog input voltage, 20 is a digital output signal output from the comparator 1, 30 is an analog comparison voltage provided from the D/A converter 2 to the comparator 1 and its first voltage is ½ of the reference voltage corresponding to the most significant bit voltage of the digital signal treated by the D/A converter 2. 40 is a clock signal CLK, 50 is a signal which is based on the value of "0" or "1" input into the register 3. When an n-bit D/A converter is used, the analog comparison voltage is converted n times. When the reference voltage is $V_{REF}$, the analog comparison voltage for the m-th or m-bit output is obtained by adding or subtracting $(V_{REF}/2^m)$ to or from the previous analog comparison voltage. Namely, when the input signal to the register 3 is "0", a new analog comparison voltage is obtained by subtracting $(V_{REF}/2^m)$ the voltage of the previous analog comparison voltage from the previous analog comparison voltage; and when the input signal to the register 3 is "1", a new analog comparison voltage is obtained by adding $(V_{REF}/2^m)$ the voltage of the previous analog comparison voltage to the previous analog comparison voltage.

Here, when an analog input voltage 10 is applied from an input terminal to one terminal of the comparator 1, the reference voltage 60 corresponding to the maximum value that can be obtained by this A/D converter is output from the reference voltage generator 4 to the D/A converter 2 so that ½ the voltage of the reference voltage is applied through the D/A converter 2 to the other terminal of the comparator 1 as the analog comparison voltage 30.

As a comparison of the voltage of the analog input voltage 10 and the analog comparison voltage 30 by the comparator 1, the comparator 1 outputs "1" as its output signal when the analog signal is higher than the analog comparison voltage, and the comparator 1 outputs "0" as its output signal when the analog input voltage 10 is lower than the analog comparison voltage 30. The digital signal 20 from the comparator 1 is incorporated into the register 3. Depending on the contents input into the register 3, the value of the next analog comparison voltage 30 is determined. In this way, by repeating the comparison between the analog input voltage 10 and the analog comparison voltage 30 for a number of times corresponding to the number of bits of the analog converter 2, an analog to digital conversion is carried out.

Note that, when the contents of the register 3 are expressed as x, the D/A converter 2 outputs:

$$V_x = \frac{x}{2^n} V_{ref}$$

where $V_{ref}$ is the reference voltage and $V_x$ is the analog comparison voltage. When the conversion starts, the register contains "1,0,0,0 . . . 0" so that the following expression is established:

$$V_x = \frac{2^{n-1}}{2^n} V_{ref} = \frac{1}{2} V_{ref}$$

In the A/D converter having such a construction as above, a case in which an 8 bit D/A converter 2 is used will be described with reference to FIG. 2.

For example, assuming that the analog input voltage 10 is a signal corresponding to 53.5 V and is input to the comparator 1. If one bit corresponds to one volt, the maximum voltage able to be converted from analog to digital is 256 V because $2^8=256$. The maximum voltage is assumed as the reference voltage $V_{ref}$, and 128 V which is ½ of the reference voltage 256 V is supplied as the analog comparison voltage $V_x$. The comparator 1 compares the comparison voltage and the previously mentioned analog input voltage of 53.5 V.

Since the analog input voltage 53.5 V is lower than the comparison voltage 128 V, the output 20 of the comparator 1 outputs "0" which is simultaneously stored in the register 3. When the value stored in the register 3 is "0", the output 50 of the register 3 instructs a decrease in the voltage 128 V of the above-mentioned analog comparison voltage 30 to ½ its value so that 64 V is assumed as a new analog comparison voltage 30 and is supplied to the comparator 1. Then, by the comparator 1, it is compared with the 53.5 V of the analog input voltage 10. As a result, since the analog input voltage 53.5 V is lower than the 64 V of the analog comparison voltage 30, the output 20 of the comparator 1 outputs "0" which is simultaneously stored in the register 3. When the value stored in the register 3 is "0", the analog comparison voltage 30 becomes 32 V in the same way as in the previous comparison. The comparator 1 compares the voltage 53.5 V of the analog input voltage 10 and the voltage 32 V of the new analog comparison voltage 30. As a result, since the 53.5 V of the analog input voltage 10 is higher, the comparator 1 outputs "1" which is simultaneously stored in the register 3.

When the "1" is stored in the register 3, the voltage 32 V of the previous analog comparison voltage 30 or 32 V and its ½ voltage of 16 V are added to make the analog comparison voltage 30 a value of 48 V. By repeating such comparisons by a number of times corresponding to the number of bits of the D/A converter 2, namely eight times, a digital signal, as shown in the lowest stage in FIG. 2, in which the value is "53" which is approximately the value of the input signal voltage 53.5 V, can be obtained.

In the above-described conventional example, when the output digital signal is 8 bits, the D/A converter 2 should also convert the 8-bit digital signal into an analog signal. The D/A converter 2, however, increases its size and cost accompanied by the increase in the number of bits to be processed. If the number of bits of the output digital signal of the A/D converter is decreased, the accuracy of the A/D converter is lowered as described in the following.

For example, when the A/D converter is one for outputting a four-bit digital signal, the D/A converter 2 should convert the four-bit digital signal into an analog signal. This case is described with reference to FIG. 1 and FIG. 3. Note that, although the same reference numerals are used in this example, the D/A converter 2, the register 3, and the reference voltage generator 4 are made as four-bit units in this four-bit A/D converter.

In the four-bit A/D converter, the comparator 1 compares the input voltage 10 and the analog comparison voltage 30 in the same way as with the eight-bit A/D converter. Since the D/A converter 2 converts only four bits in this example, only four comparisons are effected. Therefore, as shown in FIG. 3, a digital signal "0,0,1,1,0,0,0,0" in which "0" is added in the lower orders can be obtained. This value is "48" which is considerably different from the input voltage 10 of 53.5 V. Accordingly, the accuracy of the A/D converter is lowered when the number of bits is decreased.

In summary, in the conventional successive comparison type A/D converter, when an n-bit A/D converter is to be formed, an n-bit D/A converter is necessary. The D/A converter, however, has a problem in that the size and cost rapidly increase depending on the number of bits.

To decrease the cost of the A/D converter, if the number of bits of the D/A converter is decreased, there is a problem in that the accuracy of the converted digital value is reduced as in the example shown in FIG. 3.

To solve the above-mentioned problems, the present invention has an object to provide a successive approximation type A/D converter in which the accuracy as an A/D converter is not largely or adversely lowered even when a D/A converter having a bit number smaller than the bit number necessary for an A/D converter is used.

Next, an embodiment of the present invention is described with reference to FIGS. 4 to 7.

Figure 4:
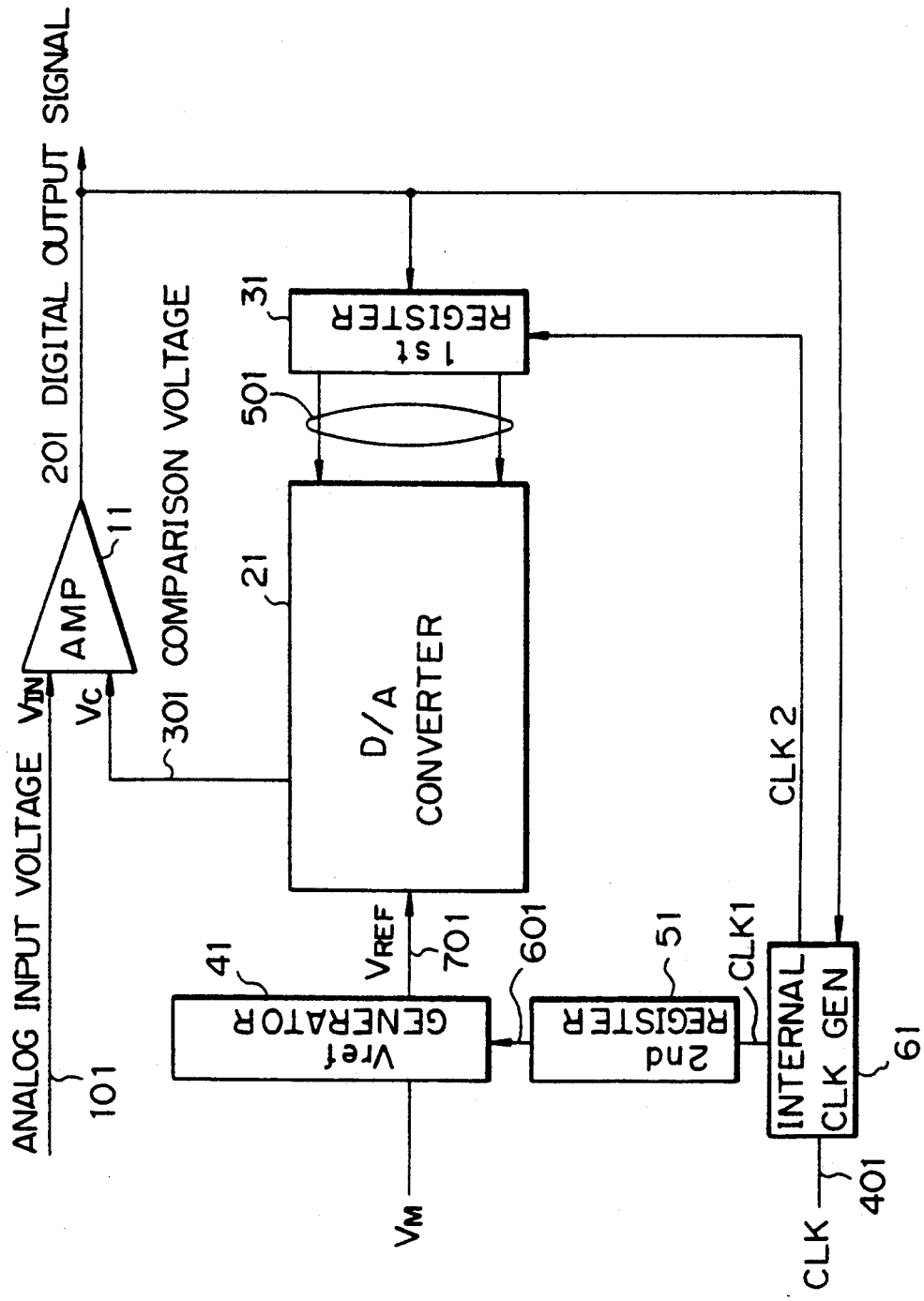
FIG. 4 is a block construction diagram of an analog-to-digital converting apparatus according to an embodiment of the present invention.

FIG. 4 is a block construction diagram of an eight-bit A/D converter according to an embodiment of the present invention. In FIG. 4, 11 is a comparator having an input terminal to which an analog input voltage $V_{IN}$ 101 of, for example, 53.5 V is input, and having an output terminal from which a digital output signal 201 of, in this embodiment, 8 bits is output. 21 is a four-bit D/A converter, 31 is a first four-bit register for storing a first dividing value, 41 is a reference voltage generator for generating a reference voltage $V_{REF}$ by dividing a maximum voltage $V_M$ of, for example, 256 V applied to the input of the reference voltage generator, 51 is a second register for storing a second dividing value, 61 is an internal clock signal generator for generating a first internal clock signal CLK1 and a second internal clock signal CLK2 based on a clock signal CLK 401 and the output digital signal 201. An analog comparison voltage 301 applied from the D/A converter 21 to another input terminal of the comparator 11. An instruction signal 501 represents the first dividing value for determining the next analog comparison voltage 301 dependent on the content of "0" or "1" (digital output signal 201) supplied from the output of the comparator 11 to the register 31. Another instruction signal 601 represents the second dividing value for determining the next reference voltage $V_{REF}$ 701.

Figure 5:
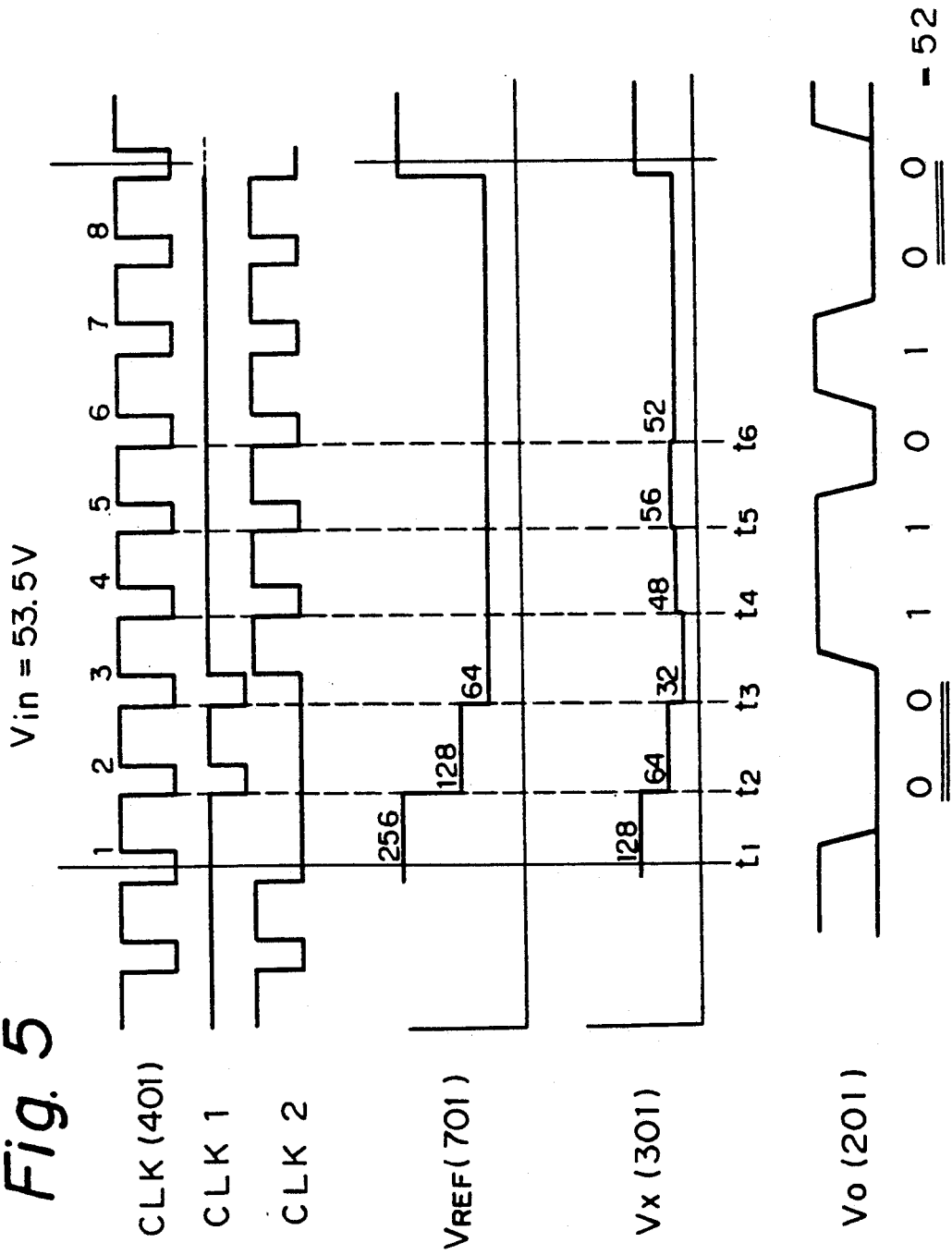
FIG. 5 is a waveform diagram for explaining the operation of the digital-analog converting apparatus shown in FIG. 4.

The operation of the A/D converter shown in FIG. 4 is described with reference to FIG. 5.

According to the embodiment of the present invention, the reference voltage $V_{REF}$ 701 is not constant as in the conventional case but is changed by dividing the maximum voltage by the second dividing value from the second register 51 until the reference voltage $V_{REF}$ 701 becomes lower than the analog input voltage 101. Before the analog comparison votlage 301 becomes lower than the analog input voltage 101 or before the second register 51 becomes full, the content of the first register 31 is kept constant. After the analog comparison voltage becomes lower than the analog input voltage 101, the reference voltage $V_{REF}$ 701 is kept constant and the D/A converter 21 generates the analog comparison voltage 301 by dividing the reference voltage $V_{REF}$ 701 by the first dividing value from the first register 31 in the same way as in the conventional converter.

At an initial time t1, the reference voltage $V_{REF}$ 701 is set at, for example, 256 V which is the maximum voltage $V_M$ to be able to be A/D converted. The maximum voltage $V_M$ is always applied to an input of the reference voltage generator 41. The reference voltage 256 V is set by setting the output of the second register 51 to be "0,0,0,0" so that the reference voltage $V_{REF}$ is made the same as the maximum voltage. At this time t1, the contents of the first register 31 are set to be "1,0,0,0,". In response to the contents of the first register 31, the D/A converter 21 converts the reference voltage $V_{REF}$ 701 of 256 V to a voltage of 128 V which is ½ of the reference voltage $V_{REF}$ 701 of 256 V. The converted voltage is input as the analog comparison voltage $V_x$ 301 from the D/A converter 21 into one terminal of the comparator 11. To the other terminal of the comparator 11, the input voltage 101 of 53.5 V is input. In the comparator 11, the voltage 53.5 V of the input voltage 101 and the voltage 128 V of the analog comparison voltage 301 are compared. Since the voltage $V_{IN}$ of the input signal 101 is lower than the analog comparison voltage 301, "0" is output from the comparator 11.

At the time t2, when "0" is output from the comparator 11, the internal clock generator 61 generates the first internal clock signal CLK1 and does not generate the second internal clock signal CLK2. In response to the first internal clock signal CLK1, the output of the second register 51 becomes "1,0,0,0" so that it instructs the reference voltage generator 41 to make the previous reference voltage 701 to be ½, namely 128 V. The D/A converter 21 converts the reference voltage 701 of 128

V into a new analog comparison voltage $V_x$301 of 64 V which is ½ of the reference voltage 128 V, based on the contents of the first register 31 which is kept at "1,0,0,0" because the second internal clock signal CLK2 is not supplied to the register 31. The analog comparison voltage 64 V is again compared with the voltage 53.5 V of the input signal 101. Since the voltage 53.5 V of the input signal is lower than the analog comparison voltage 64 V, the comparator 11 again outputs the digital output signal "0".

At the time t3, in response to the digital output signal "0", the internal clock generator 61 generates the first internal clock signal CLK1 and does not generate the second internal clock signal CLK2. In response to the first internal clock signal CLK1, the second register 51 instructs the reference voltage generator 41 to make the previous reference voltage 701 to be ½, namely 64 V. The D/A converter 21 converts the reference voltage 701 of 64 V into a new analog comparison voltage 32 V which is ½ of the reference voltage 64 V, based on the contents of the register 31 which is kept to be "1,0,0,0" because the second internal clock signal CLK2 is not supplied to the register 31. The comparator 11 compares the analog input voltage of 53.5 V and the analog comparison voltage of 32 V. As a result, since the voltage 53.5 V of the input signal 101 is higher than the analog comparison voltage 32 V, the output signal 201 of the comparator 11 is made "1", and the output signal 201 is stored in the first register 31.

At the time t4, since the output signal 201 of the comparator 11 has become "1" for the first time, the internal clock signal generator 61 does not generate the first clock signal CLK1 but generates the second clock signal CLK2. Therefore, the contents of the second register 51 are kept unchanged so that the reference voltage $V_{REF}$ from the reference voltage generator 41 is kept to be the same as the previous reference voltage, and the contents of the first register 31 at this time is changed from "1,0,0,0" to "1,1,0,0" in response to the second clock signal CLK2. Then, the D/A converter 21 converts the reference voltage of 64 V into an analog comparison voltage $V_x$301 of 48 V which is an intermediate voltage between 64 V and 32 V. This conversion is effected by the dividing value "1,1,0,0". The voltage 48 V of the comparison voltage 301 and the voltage 53.5 V of the input signal 101 are compared. Since the voltage 53.5 V is higher than the comparison voltage 48 V, the comparator 11 outputs "1".

After the time t4, the contents of the first register 31 is changed by incoorporating the digital output signal 201 in response to the second clock signal CLK2, and the contents of the second register 51 are kept constant so that the reference voltage $V_{REF}$ 701 is kept constant at 64 V. As a result, the analog comparison voltage is obtained by dividing the constant reference voltage by the contents of the first register 31 in the same way as in the conventional A/D converter. As shown in FIG. 5, after the processes are repeated four times to get "1,1,0,1" as the output signal 201, since the output signal up to this time has only six bits which is less than eight bits necessary to be obtained in the A/D conversion, "0"s of insufficient bits are added to obtain a total of 8 bits.

At this time, the value obtained from the output signal "0,0,1,1,0,1,0,0" becomes the value "52" V. Thus, in comparison with the case when a four-bit D/A converter 2 is used as in the conventional example, the accuracy is increased.

Figure 6:
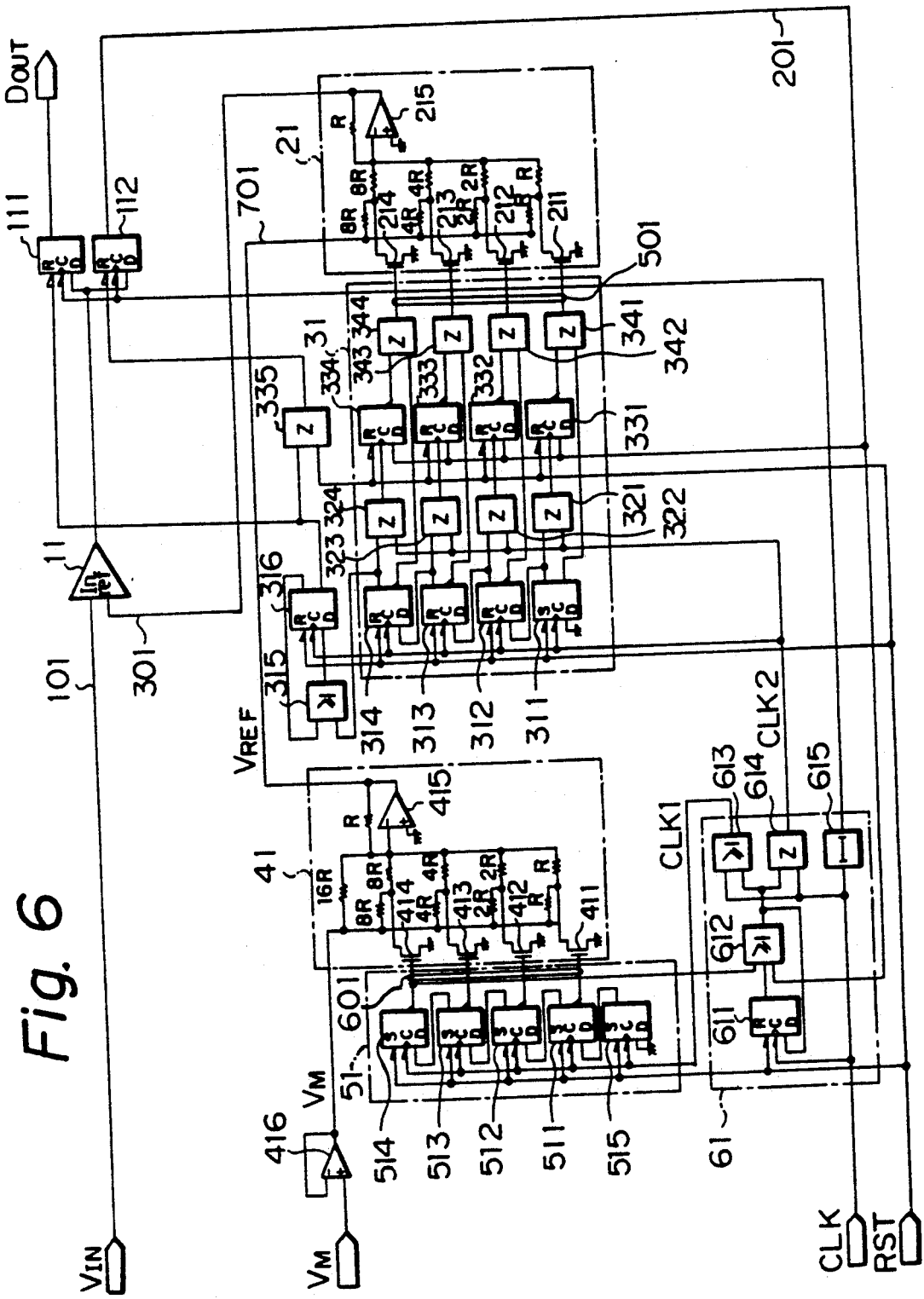
FIG. 6 is a detailed circuit diagram of the analog-to-digital converting apparatus shown in FIG. 4.

FIG. 6 is a circuit diagram showing in more detail the constitution of the A/D converter shown in FIG. 4. In FIGS. 4 and 6, the same reference numerals represent the same parts.

As shown in FIG. 6, the D/A converter 21 is an inverting amplifier consisting of an operational amplifier 215, a feed back resistor having a resistance R connected between the output and the inverting input of the operational amplifier 215, input resistors having resistances 8R, 8R, 4R, 4R, 2R, 2R, R, and R connected as shown in the figure, and switching transistors 211 to 214. Hereinafter, these resistors are referred by their resistance values. The two resistors 8R, the two resistors 4R, the two resistors 2R, and the two resistors R are respectively connected in series between the inverting input of the operational amplifier 215 and the output 701 of the reference voltage generator 41. The inverting input of the operational amplifier 215 is connected through the resistors 8R, 4R, 2R, or R to the respective drain of each switching transistor 214, 213, 212, or 211. The noninverting input of the operational amplifier 215 is grounded. The output of the operational amplifier 215 is connected through the analog comparison voltage line 301 to one input, i.e., a reference input ref, of the comparator 11.

The first register 31 consists of a first group of flip-flops 311 to 314 forming a four-bit register, a first group of AND gates 321 to 324, a second group of flip-flops 331 to 334, and a second group of AND gates 341 to 344. The data input of the flip-flop 311 is grounded, the data inputs of the flip-flops 312 to 314 are connected to the noninverting outputs of the previous stage flip-flops 311 to 313, respectively. Each of the first group of flip-flops 311 to 314 latches data in response to a falling edge of the second internal clock signal CLK2. The noninverting outputs of the flip-flops 311 to 314 are respectively connected to inputs of the first group of AND gates 321 to 324, while the other inputs of the AND gates 321 to 324 receive the second internal clock signal CLK2. The inverting outputs of the flip-flops 311 to 314 are respectively connected to inputs of the second group of AND gates 341 to 344.

Each of the second group of flip-flops 331 to 334 latches data in response to a rising edge of the outputs of the first group of AND gates 321 to 324. The data inputs D of the second group of flip-flops 331 to 334 are commonly connected to the digital output signal line 201. The inverting outputs of the flip-flops 331 to 334 are connected to the other inputs of the second group of AND gates 341 to 344, respectively. The outputs of the AND gates 341 to 344 are connected to the gates of the switching transistors 211 to 214, respectively.

The noninverting output of the last stage flip-flop 314 is connected to an input of an OR gate 315. The output of the OR gate 315 is connected to the data input of a flip-flop 316, the noninverting output of which is connected to another input of the OR gate 315.

The inverting output of the flip-flop 316 is connected to a reset input R of a flip-flop 111. The inverting output of the flip-flop 316 is also connected to an input of an AND gate 335, another input of which receives the reset signal RST. The output of the AND gate 335 is connected to the reset input R of the flip-flop 112. The data inputs D of the flip-flops 111 and 112 receive the output of the comparator 11.

The reference voltage generator 41 is also an inverting amplifier consisting of an operational amplifier 415, a feed back resistor having a resistance R connected between the output and the inverting input of the operational amplifier 415, input resistors having resistances 16R, 8R, 8R, 4R, 4R, 2R, 2R, R, and R connected as shown in the figure, and switching transistors 411 to 414. Hereinafter, these resistors are also referred by their resistance values as in the D/A converter 21. The resistor 16R, the two resistors 8R, the two resistors 4R, the two resistors 2R, and the two resistors R are respectively connected in series between the inverting input of the operational amplifier 415 and an output of a voltage follower circuit 416 which provides the maximum voltage $V_M$. The inverting input of the operational amplifier 415 is connected through the resistors 8R, 4R, 2R, or R to respective drain of each switching transistor 414, 413, 412, or 411, respectively. The noninverting input of the operational amplifier 415 is grounded. The output of the operational amplifier 415 is connected to the reference voltage line 701.

The second register 51 consists of five flip-flops 511 to 515 which form a five-stage shift register. The flip-flops 511 to 515 latch data in response to a falling edge of the first internal clock signal CLK1. The data input of the flip-flop 515 is grounded. The noninverting outputs of the flip-flops 515, 511, 512, and 513 are connected to the data inputs of the next stage flip-flops 511, 512, 513, and 514, respectively. The inverted outputs of the flip-flops 511 to 514 are connected to the gates of the switching transistor 411 to 414, respectively.

The clock signal generator 61 consists of a flip-flop 611, OR gates 612 and 613, an AND gate 614, and a delay circuit 615. The OR gate 612 has a first input for receiving the inverting output of the flip-flop 514 which is the last stage of the second register 51, a second input connected to the noninverting output of the flip-flop 611, and a third input connected to the digital output signal line 201. The output of the OR gate 612 is connected to the data input end D of the flip-flop 611, one input of the OR gate 613, and one input of the AND gate 614. The other inputs of the OR gate 613 and the AND gate 614 recieve the clock signal CLK. The OR gate 613 outputs the first internal clock signal. The AND gate 614 outputs the second internal clock signal CLK2. The clock signal CLK is delayed by the delay circuit 615 and the delayed clock signal is applied to the clock input ends C of the flip-flops 111 and 112.

The operation of the circuit shown in FIG. 6 is described with reference to FIG. 7A.

Figure 7A:
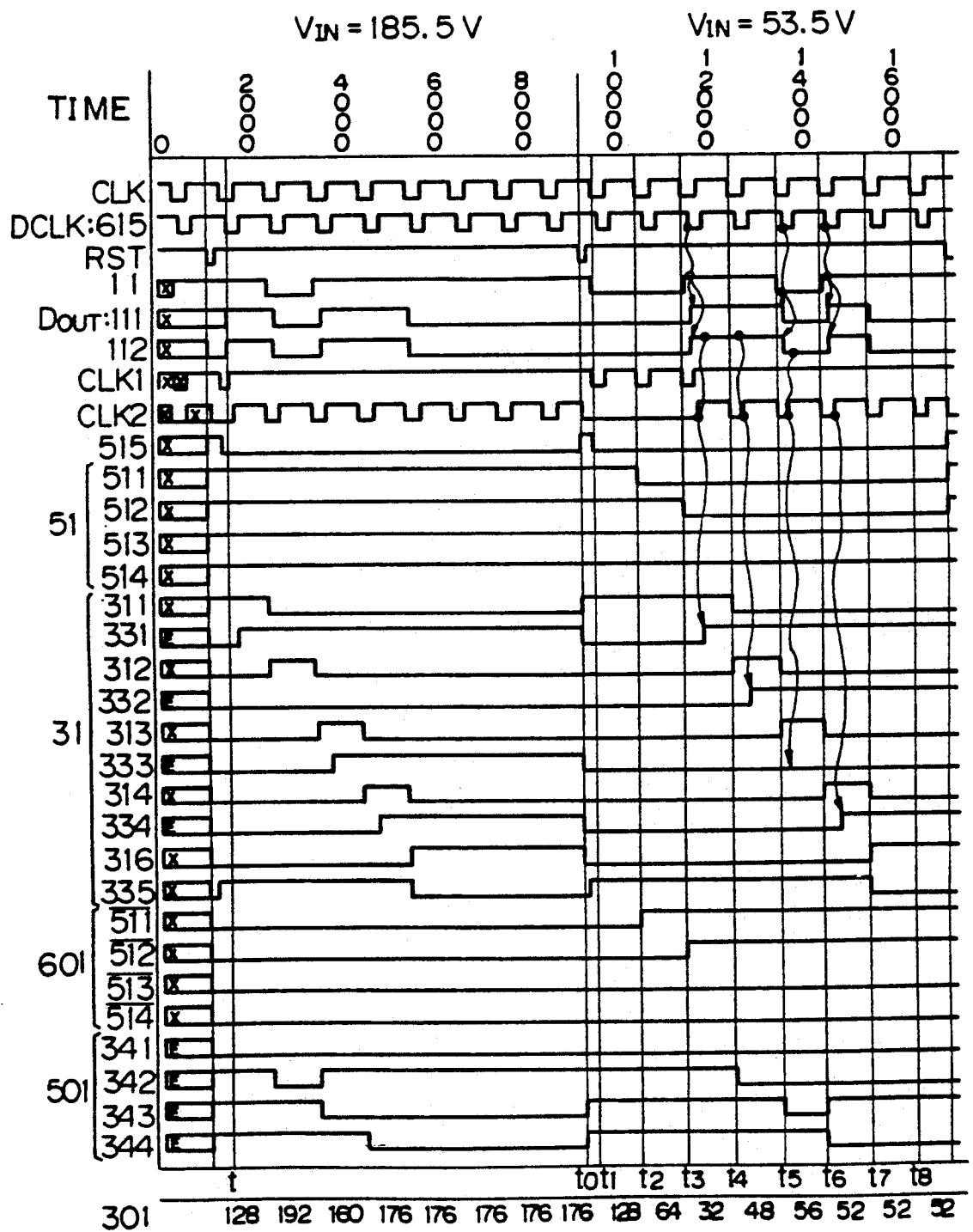
FIGS. 7A to 7C are waveform diagrams for explaining the operation of the circuit shown in FIG. 6.

FIG. 7A shows voltage waveforms at various points in the circuit shown in FIG. 6, in two cases, i.e., when the analog input voltage $V_{IN}$ to be converted is 185.5 V, and when the analog input voltage $V_{IN}$ is 53.5 V. The left-hand side of the figure represents the reference numerals of the devices from which the corresponding signals shown in the figure are output.

The operation is described as an example for the case when the input voltage $V_{IN}$ is 53.5 V.

The following table shows the contents of the flip-flops 311 to 314, 331 to 334, 511 to 515, and the outputs of the AND gates 341-344, respectively, in relation to times t0 to t8.

TABLE 1

|    | 311-314 | 331-334 | 341-344 | 511-514 |
|----|---------|---------|---------|---------|
| t0 | 1000    | 0000    | 0111    | 1111    |
| t1 | 1000    | 0000    | 0111    | 1111    |
| t2 | 1000    | 0000    | 0111    | 0111    |
| t3 | 1000    | 0000    | 0111    | 0011    |
| t4 | 0100    | 1000    | 0011    | 0011    |
| t5 | 0010    | 1100    | 0001    | 0011    |

TABLE 1-continued

|    | 311-314 | 331-334 | 341-344 | 511-514 |
|----|---------|---------|---------|---------|
| t6 | 0001    | 1100    | 0010    | 0011    |
| t7 | 0000    | 1101    | 0010    | 0011    |
| t8 | 0000    | 1101    | 0010    | 0011    |

As will be seen from the above table and from FIG. 7A, at a time t0, the reset signal RST is applied to the set terminal S of the flip-flop 311, to the reset terminal R of the flip-flops 312 to 314, and 331 to 334, and to the set terminal S of the flip-flops 511 to 515. The reset signal RST is also applied to the reset terminal R of the flip-flop 316, and to one input of the AND gate 335. In response to the falling edge of the reset signal RST, the flip-flops 311 to 314 are set or reset to "1,0,0,0", the flip-flops 331 to 334 are reset to "0,0,0,0", and the flip-flop 511 to 514 are set to "1,1,1,1". Also, the flip-flop 316 is reset to "0".

In this state at the time t0, the inverting outputs of the flip-flops 511 to 514 are "0,0,0,0" so that the transistors 411 to 414 are in the OFF states. Therefore, the input resistance of the operational amplifier 415 is formed by all of the resistors 16R, 8R, 4R, 2R, and R connected between the inverting input of the operational amplifier 415 and the output of the voltage follower circuit 416, namely, the input resistance of the operational amplifier 415 is R at this stage. Accordingly, the operational amplifier 415 outputs $-(R/R) \times V_M = -V_M = -256$ V.

In this stage at the time t0 also, the outputs of the AND gates 341 to 344 are "0,1,1,1" so that the transistor 211 is in the OFF state, while the other transistors 212 to 214 are in the ON states. Accordingly, the operational amplifier 215 outputs the analog comparison voltage 301 of $-(R/2R) \times V_{REF} = -(\frac{1}{2}) \times 256$ V $= -128$ V.

Since the flip-flop 611 is reset by the reset signal RST, the output of the flip-flop 611 is "0". Also, the inverted output of the flip-flop 514 is "0" at the time t1. Further the output of the flip-flop 112 is also "0" at the time t1. Therefore, the output of the OR gate 612 is "0". As long as the output of the OR gate 612 is "0", the OR gate 613 passes the clock signal CLK as the first internal clock signal CLK1. The AND gate 614 does not output the second internal clock signal CLK2 when the output of the OR gate 612 is "0".

At the time t1, in response to the fall of the first internal clock signal CLK1, the flip-flop 515 latches data "0" because its data input end D is grounded, while the flip-flops 511 to 514 latch the data of the previous stage flip-flops, respectively. As a result, flip-flops 511 to 514 output "0,0,0,0" from their inverted outputs so that the operational amplifier 415 outputs the reference voltage $V_{REF}$ equal to 256 V in the same way as in the case at the time t0. At the time t1, because the second internal clock signal CLK2 is not output from the AND gate 614, the contents of the flip-flops 311 to 314 are the same as those at the time t0, and the AND gates 321 to 324 output "0"s. Accordingly, the contents of the flip-flops 331 to 334 are not changed. Thus, the D/A converter 21 outputs the same analog comparison voltage 301 of 128 V. The comparator 11 compares the input voltage $V_{IN}$ of 53.5 V and the analog comparison voltage of 128 V and outputs "0". After the D/A conversion is completed so that the output of the comparator is obtained, in response to a fall of the delayed clock signal DCLK, the flip-flops 111 and 112 latch the output "0" of the comparator 11. Thus, the flip-flop 111 and 112 outputs "0".

At the time t2, the content of the flip-flop 515, which is "0", is shifted to the flip-flop 511, and therefore the contents of the flip-flops 511 to 514 become "0,1,1,1" so that the inverted outputs thereof are "1,0,0,0". Therefore, only the transistor 411 is turned ON and the other transistors 412 to 414 are in the OFF states. As a result, the input resistance of the operational amplifier 415 becomes 2R. Thus, the operational amplifier 415 outputs $-(\frac{1}{2})V_M = -128$ V as the reference voltage $V_{REF}$. The contents of the flip-flops 311 to 314 and 331 to 334 are still unchanged at this time t2 because the second internal clock signal CLK2 is not yet generated. As a result, the operational amplifier 215 outputs $-(\frac{1}{2}) V_{REF} = -64$ V as the analog comparison voltage. Since this analog comparison voltage of 64 V is still lower than the input voltage of 53.5 V, the flip-flops 111 and 112 output "0" again.

At the time t3, similar to the state at the time t2, the contents of the flip-flops 511 to 514 are shifted to "0,0,1,1". Therefore, the input resistance of the operational amplifier 415 becomes 4R so that it outputs $-(R/4R) \times 256$ V $= 64$ V. Since the outputs of the AND gates 341 to 344 are not changed because the second internal clock signal CLK2 is not yet generated at this stage, the operational amplifier 215 outputs $-(\frac{1}{2}) \times 64$ V $= -32$ V as the analog comparison voltage 301. The comparator 11 compares the input voltage of 53.5 V and the analog comparison voltage 32 V. As a result, the comparator 11 outputs "1" for the first time. The flip-flops 111 and 112 latch the data "1" in response to the falling edge of the delayed clock signal DCLK. Thus, the flip-flops 111 and 112 output "1". When the data "1" is input to the OR gate 612, the output thereof becomes "1" regardless of the outputs of the flip-flops 611 and 514. Therefore, the output of the AND gate 614 rises simultaneously with the rise of the clock signal CLK so that the data is latched in the flip-flop 314. Since the output "1" of the OR gate 612 is latched by the flip-flop 611 at the time t4 in response to the falling edge of the clock signal CLK, the OR gate 612 always outputs "1" after the time t4 even when the output of the flip-flop 112 becomes "0". As a result, the output of the OR gate 613, i.e., the first internal clock signal CLK1 is kept at "1" regardless of the clock signal CLK, whereas the AND gate 614 passes the clock signal CLK as the second internal clock signal CLK2. Since the first internal clock signal CLK1 is not generated after the flip-flop 112 latches the data "1", the reference voltage generator 41 outputs the constant reference voltage 64 V after the time t4.

After the time t3, the contents of the flip-flops 311 to 314 are also "1,0,0,0". Therefore, only the AND gate 321 passes the internal clock signal CLK2, and the AND gates 322 to 324 do not pass the second internal clock signal CLK2. Therefore, in response to the rising edge of the second internal clock signal CLK2, the flip-flop 331 latches the data "1" output from the flip-flop 112. As a result, the contents of the flip-flops 331 to 334 are "1,0,0,0".

At the time t4, in response to the falling edge of the second internal clock signal CLK2, the flip-flop 311 latches "0" because its data input end D is grounded, and the contents of the flip-flops 311 to 314 are shifted from "1,0,0,0" to "0,1,0,0". Therefore, the inverted outputs of the flip-flops 311 to 314 are "1,0,1,1" and the inverted outputs of the flip-flops 331 to 334 are "0,1,1,1". As a result, at the time t4, the AND gates 341 to 344 output "0,0,1,1" so that the transistors 211 and 212 are in the OFF states and the transistors 213 and 214 are in the ON states. Accordingly, the input resistance of the operational amplifier 215 becomes $(4R \times 2R)/(4R+2R) = (4/3)R$. Thus, the operational amplifier 215 outputs $-(R/(4/3)R) \times (-64$ V$) = 48$ V which is lower than the input voltage 53.5 V. As a result, the flip-flops 111 and 112 output "1" at the time t4.

After the time t4 and before the time t5, the AND gate 322 passes the second internal clock signal CLK2. Therefore, in response to the rising edge of the second internal clock signal CLK2 between the times t4 and t5, the flip-flops 332 latches the data "1" from the flip-flop 112. The other AND gates 321, 323, and 324 do not pass the second internal clock signal CLK2 so that the flip-flops 331, 333, and 334 do not change their contents.

At the time t5, the output of the operational amplifier 415 is kept to ($-64$ V). The flip-flops 311 to 314 shifts the contents from "0,1,0,0" to "0,0,1,0" in response to the falling edge of the second internal clock signal CLK2. And the flip-flops 331 to 334 latch the data "1,1,0,0". Therefore, the AND gates 341 to 344 output "0,0,0,1" so that the input resistance of the operational amplifier 215 becomes $(8/7)R$. Thus, the operational amplifier 215 outputs $64$ V $\times 7/8 = 56$ V which is higher than the input voltage 53.5 V. The comparator 11 then output "0". The outputs of the flip-flops 111 and 112 then fall to "0" in response to the falling edge of the delayed clock signal DCLK. Since the AND gate 323 receives "1" from the flip-flop 313, the AND gate 323 passes the second internal clock signal CLK2. In response to te rising edge of the second internal clock signal CLK2, the flip-flop 333 latches the data "0" from the flip-flop 112.

At the time t6, the output of the operational amplifier 415 is kept to ($-64$ V). The flip-flops 311 to 314 shift the contents from "0,0,1,0" to "0,0,0,1" in response to the falling edge of the second internal clock signal CLK2. And the flip-flops 331 to 334 latch the data "1,1,0,0" which is the same as the previous time t5 because the flip-flop 333 latched the data "0" output from the flip-flop 112 at the time between the times t5 and t6. Therefore, the AND gates 341 to 344 output "0,0,1,0" so that the input resistance of the operational amplifier 215 becomes $(64/52)R$. Thus, the operational amplifier 215 outputs $64$ V $\times 52/64 = 52$ V which is lower than the input voltage 53.5 V. The comparator 11 then outputs "1". The outputs of the flip-flops 111 and 112 then rise to "1" in response to the falling edge of the delayed clock signal DCLK. Since the AND gate 324 receives "1" from the flip-flop 314, the AND gate 324 passes the second internal clock signal CLK2. In response to the rising edge of the clock signal CLK2, the flip-flop 334 latches the data "1" from the flip-flop 112.

After the final stage flip-flop 314 latches the data "1", it passes through the OR gate 315 to be supplied to the data input end D of the flip-flop 316 which latches it in response to the falling edge of the second internal clock signal CLK2 at the time t7. Since the noninverted output of the flip-flop 316 is connected to another input of the OR gate 315, the flip-flop 316 always latches "1" after the time t7 and until it is reset by the reset signal RST. The inverted output of the flip-flop 316 is connected to the reset terminal R of the flip-flop 111. Therefore, after the time t7, the flip-flop 111 always outputs "0" regardless of the output of the comparator 11. Thus, the additional bits "0,0" are output from the flip-flop 111 at the time t7 and t8. The inverted output of the flip-flop 316 is connected to an input of the AND gate 335. Since the inverted output of the flip-flop 316 is "0", the AND gate 335 always outputs "0" so that the flip-flop 112 is continuously reset. Note that all of the flip-flops are set or reset when "0"s are input to the set and reset terminals thereof. This is referred to as an asynchronous clear. Therefore, only when the flip-flop 316 is in the reset state, can the reset signal RST pass through the AND gate 335 to reset the flip-flop 112. In other words, the flip-flop 112 is not reset during the time t7 and t8.

At the time t7 and t8, the flip-flops 311 to 314 store "0,0,0,0", and the flip-flops 331 to 334 store "1,1,0,1". Therefore, the outputs of the AND gates 341 to 344 are "0,0,1,0". Thus, the operational amplifier 215 outputs 52 V as the analog comparison voltage.

In FIG. 7A, another example is shown for the case when the input voltage $V_{IN}$ is 185.5 V. As will be seen from the figure, since the input voltage is sufficiently high in comparison with the initial analog comparison voltage 128 V, the comparator 11 outputs "1" from the beginning of the A/D conversion. Therefore, the first internal clock signal CLK1 is not generated and the second internal clock signal CLK2 is generated after the first fall of the delayed clock signal DCLK. Thus, the reference voltage $V_{REF}$ is kept constant to be 256 V, and the analog comparison voltage 301 is changed to 128 V, 192 V, 160 V, and 176 V, only by the output of the first register 31.

Figure 7B:
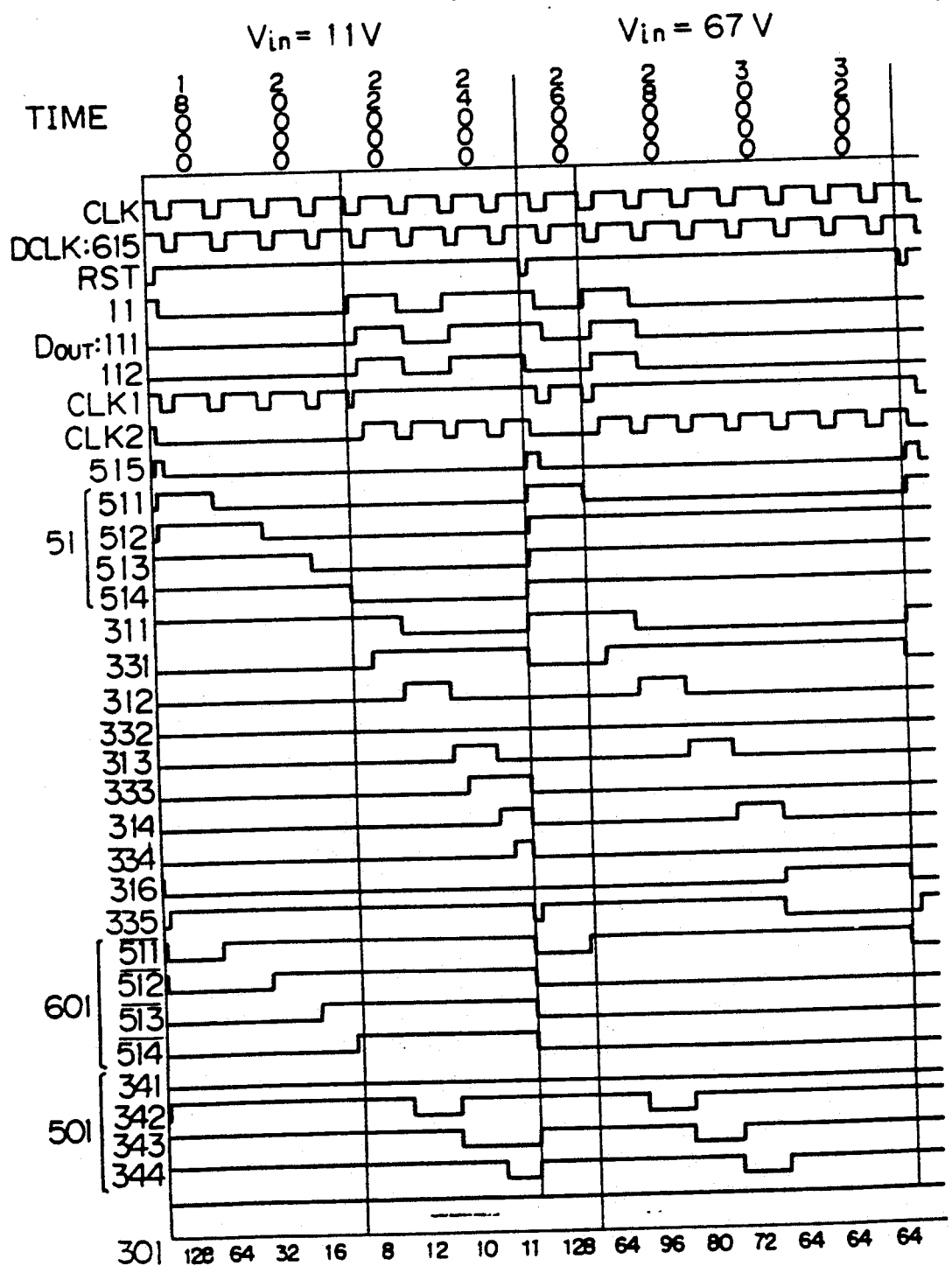

In FIG. 7B, still another example is shown in the left-hand side in the figure for the case when the input voltage $V_{In}$ is 11 V. As will be seen from the figure, since the input voltage 11 V is sufficiently low in comparison with the initial analog comparison voltage 128 V, even when the contents of all of the flip-flops 511–514 become "0", the analog comparison voltage does not become lower than the input voltage. In this case, when the flip-flop 514 latches "0", the input of the OR gate 612 becomes "1" so that the second internal clock signal CLK2 is generated. Accordingly, the analog comparison voltages of 128 V, 64 V, 32 V, and 16 V are formed only by the reference voltage generator 41, and the analog comparison voltages of 8 V, 12 V, 10 V, and 11 V are formed only by the first register 31.

In FIG. 7B, the right-hand side shows a case when the input voltage $V_{IN}$ is 67 V. As shown in the figure, the first internal clock signal CLK1 is generated until the analog comparison voltage 301 becomes lower than the input voltage $V_{IN}$ of 67 V.

Figure 7C:
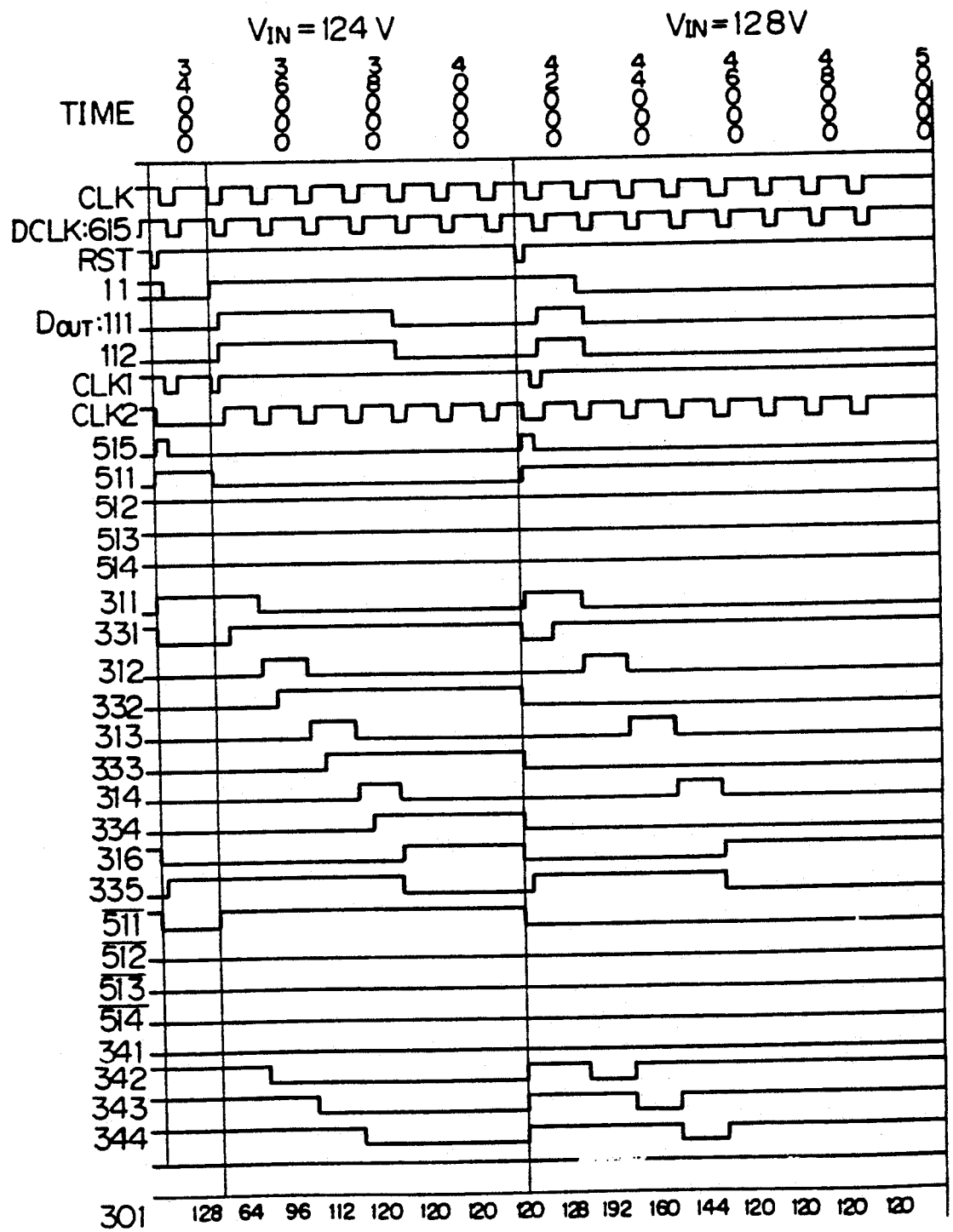

FIG. 7C shows still other examples for the cases when the input voltage $V_{IN}$ is 124 V and 128 V. As shown in FIG. 7C, when the input voltage is 124 V, the first internal clock signal CLK1 is generated when the analog comparison voltage 301 is 128 V, and the second internal clock signal CLK2 is generated after the analog comparison voltage of 64 V is generated.

When the input voltage is 128 V, the first internal clock signal CLK1 is not generated because the initial analog comparison voltage of 128 V is the same as the input voltage $V_{IN}$. Therefore, the analog comparison voltage is varied only by the outputs of the AND gates 341 to 344 in response to the second internal clock signal CLK2.

The present invention is not restricted by the above-described embodiment but various modifications are possible without departing from the scope of the present invention. For example, in FIG. 6 and FIG. 7A, "0"s are added, at the times t7 and t8, to the digital output signal $D_{OUT}$ by means of the OR gate 315 and the flip/flop 316, however, instead of "0"s, "1"s may be added according to the present invention. Further, to attain the 8-bit A/D conversion as described in the above embodiment, the number of stages of the first shift register 31 and the number of stages of the second shift register 51 may be other than four stages as in the above-described embodiment. For example, if the first shift register 31 is formed as 6-bit register, the D/A converter 21 must be formed as a 6-bit D/A converter, and the second shift register 51 must be formed as 2-bit shift register.

From the foregoing description, it will be apparent that, according to the present invention, in a successive comparison type A/D converter having a D/A converter, by varying the reference voltage until the analog comparison voltage becomes lower than the input voltage, the number of bits of the D/A converter can be decreased without seriously deteriorating the accuracy. Thus, an A/D converter can be obtained at a lower cost.

Further, even when a large number of output bits is necessary by an A/D converter, a D/A converter of a relatively small number of bits, which may be easily available at a lower cost, can be used according to the present invention.

I claim:

1. An A/D converter for converting an analog input voltage into a digital output signal, comprising:
    comparator means for comparing the analog input voltage and an analog comparison voltage to output the digital output signal;
    D/A converter means for generating the analog comparison voltage in response to a reference voltage and a first digital signal;
    first register means for storing the digital output signal and for providing the first digital signal;
    reference voltage generator means for generating the reference voltage by changing a predetermined voltage in response to a second digital signal; and
    second register means for storing the second digital signal, wherein before said analog comparison voltage becomes lower than the analog input voltage for a first time after the A/D conversion starts, the second digital signal is changed in response to a first clock signal so as to decrease the reference voltage, and the first digital signal output from said first register means is not changed; and after the analog comparison voltage becomes lower than the analog input voltage for the first time after the A/D conversion starts, the second digital signal is not changed so that the reference voltage is held constant, and the first digital signal is changed in response to a second clock signal and the digital output signal from said comparator so as to change the analog comparison voltage.

2. An A/D converter as claimed in claim 1, wherein said comparator means outputs a first digital level when the analog comparison voltage is higher than the reference voltage and outputs a second digital level when the analog comparison voltage is lower than the reference voltage.

3. An A/D converter as claimed in claim 2, further comprising
    clock signal generator means for generating the first clock signal and the second clock signal in response to an external clock signal and the digital output signal, the first clock signal being generated until the analog comparison voltage becomes lower than the analog input voltage for a first time after A/D conversion begins, the second clock signal being generated after the analog comparison voltage becomes lower than the reference voltage for a first time after A/D conversion begins.

4. An A/D converter as claimed in claim 3, wherein said reference voltage generator means comprises
a first inverting amplifier comprising
first input resistors having a first input resistance, and
a first operational amplifier having an inverting input operatively connected to receive the predetermined voltage through the first input resistors, a noninverting input connected to ground, and an output connected to an input of said first register means, and
first switching transistors operatively connected to switch in response to the second digital signal the first input resistance of said first input resistors.

5. An A/D converter as claimed in claim 4, wherein said second register means comprises a first shift register means for shifting the second digital signal in response to the first clock signal.

6. An A/D converter as claimed in claim 5, wherein said A/D converter means comprises
a second inverting amplifier comprising
second input resistors having a second input resistance, and
a second operational amplifier having an inverting input operatively connected to receive the reference voltage through the second input resistors, a noninverting input connected to ground, and an output connected to the analog comparison voltage to said comparator means, and
second switching transistors operatively connected to switch in response to the first digital signal output from said first register the second input resistance of said second input resistors.

7. An A/D converter as claimed in claim 6, wherein said first register means comprises data changing means for changing the first digital signal in response to the second clock signal and the digital output signal.

8. An A/D converter as claimed in claim 7, wherein said A/D converter is an n-bit A/D converter for converting the analog input voltage into an n-bit digital signal, said first digital signal output from said first register means is a p-bit digital signal and the second digital signal output from said second register means is a q-bit digital signal, where p plus q equal n.

9. An A/D converter as claimed in claim 8, further comprising additional bit generating means for generating additional bits of a predetermined digital level to be output as the digital output signal after said first register means receives p-bits of said digital output signal.

10. An A/D converter as claimed in claim 9, wherein said first shift register means comprises (p+1) stages of flip-flops which are set to the second digital level before starting the A/D conversion, a first of said (p+1) stages of flip-flops latching a shifting signal having the first digital level in response to the first clock signal, the shifting signal being shifted through said (p+1) stages of flip-flops in response to said first clock signal, the second digital signal being p-bits and output from p stages of flip-flops in said (p+1) stages.

11. An A/D converter as claimed in claim 10, wherein the first input resistance of said first input resistors is doubled in response to a change of the second digital signal.

12. A successive comparison type A/D converter as claimed in claim 11, wherein said data changing means comprises
a second shift register comprising a first q stages of flip-flops, a first stage of said first q stages of flip-flops being set to store another shifting signal and remaining stages of said first q stages of flip-flops being reset before starting the A/D conversion, the another shifting signal being shifted through said first q stages of flip-flops in response to the second clock signal; and
first-digital-signal generating means, comprising a second q stages of flip-flops, for incorporating, in response to the second clock signal, the digital output signal into one of said second q stages corresponding to one stage in said first q stages storing the another shifting signal, the first digital signal being generated by logically adding the outputs of said first q stages of flip-flops and the outputs of said second q stages of flip-flops.

13. An A/D converter as claimed in claim 12, wherein said first-digital-signal generating means comprises
first q AND gates each having one input connected to noninverting outputs of said first q stages of flip-flops respectively, and another input commonly connected to receive said second clock signal and outputs connected to clock inputs of said second q stages of flip-flops; and
second q AND gates each having one input connected to inverted outputs of said second q stages of flip-flops, respectively, and another input connected to inverted outputs of said first q stages of flip-flops, respectively, and outputs for providing the first digital signal; and
wherein said second q stages of flip-flops having data inputs commonly connected to receive the digital output signal.

14. An A/D converter as claimed in claim 13, wherein said additional bit generating means comprises
latching means for latching the another shifting signal when the another shifting bit is output from a final stage of said first q stages of flip-flops, and
digital output signal latching means having a data input connected to the output of said comparator means, a reset terminal connected to receive the another shifting signal from said latching means, and an output for providing the digital output signal.

15. An A/D converter as claimed in claim 14, further comprising another latching means having a data input for receiving the digital output signal output from said comparator means, a reset terminal connected to receive only a reset signal and disconnected so as not to receive the another shifting signal, and an output for providing the digital output signal to said reference voltage generator means and said clock signal generator means.

16. An A/D converter as claimed in claim 15, wherein said clock signal generator means comprises:
a frist OR gate having a first input connected to the inverted output of the final stage in said (p+1) stages of flip-flops, and a second input connected to the output of said another latching means;
an OR gate output latching flip-flop for latching the output signal from said first OR gate in response to said external clock signal, the output of said OR gate output latching flip-flop being connected to a third input of said first OR gate;

a second OR gate having an input for receiving the external clock signal, another input for receiving the output signal from said first OR gate, and an output for providing said first clock signal; and an AND gate having an input connected to the output of said first OR gate, another input connected to receive said external clock signal, and an output for providing the second clock signal.

17. A successive comparison type A/D converter as claimed in claim 16, wherein said clock signal generator means further comprises a delay circuit means for delaying the external clock signal for at least a time sufficient to stabilize the output signal from said comparator means, the output signal of said delay circuit being supplied to said latching means.

18. A method of analog to digital conversion of an analog input voltage to a digital output signal comprising the steps of:
 (a) determining the digital output signal by comparing the analog input voltage with an analog comparison voltage;
 (b) varying a reference voltage by decreasing the reference voltage until the analog comparison voltage becomes lower than the analog input voltage for a first time;
 (c) determining the analog comparison voltage by digital to analog conversion based on the reference voltage until the analog comparison voltage becomes lower than the analog input voltage for the first time; and
 (d) determining the analog comparison voltage by digital to analog conversion of a value indicative of the digital output signal after the analog comparison voltage becomes lower than the analog input voltage for the first time.

19. An apparatus for analog to digital conversion of an analog input voltage to a digital output signal comprising:
 (a) first means for determining the digital output signal by comparing the analog input voltage with an analog comparison voltage;
 (b) second means for varying a reference voltage by decreasing the reference voltage until the analog comparison voltage becomes lower than the analog input voltage for a first time;
 (c) third means for determining the analog comparison voltage by digital to analog conversion based on the reference voltage until the analog comparison voltage becomes lower than the analog input voltage for the first time; and
 (d) fourth means for determining the analog comparison voltage by digital to analog conversion of a value indicative of the digital output signal after the analog comparison voltage becomes lower than the analog input voltage for the first time.

* * * * *